United States Patent [19]

Thompson

[11] 4,146,440
[45] Mar. 27, 1979

[54] METHOD FOR FORMING AN ALUMINUM INTERCONNECT STRUCTURE ON AN INTEGRATED CIRCUIT CHIP

[75] Inventor: Charles E. Thompson, Carlsbad, Calif.

[73] Assignee: Burroughs Corporation, Detroit, Mich.

[21] Appl. No.: 892,943

[22] Filed: Apr. 3, 1978

[51] Int. Cl.² .................. C25D 11/04; C25D 11/12
[52] U.S. Cl. ...................................... 204/15; 204/42
[58] Field of Search ................. 204/15, 33, 58, 42

[56] References Cited

U.S. PATENT DOCUMENTS

| | | | |
|---|---|---|---|
| 3,827,949 | 8/1974 | Platter et al. | 204/15 |
| 4,003,772 | 1/1977 | Hanazono et al. | 204/58 |
| 4,045,302 | 8/1977 | Gibbs et al. | 204/15 |

Primary Examiner—T. M. Tufariello
Attorney, Agent, or Firm—Mervyn L. Young; Kevin R. Peterson

[57] ABSTRACT

A method for forming an interconnect structure on an integrated circuit chip by employing a single chamber for both the required etching and anodization. It has been discovered that an etchant-electrolyte such as phosphoric acid solution in the ratios of one part phosphoric acid to four parts of water can serve as both an etchant and an electrolyte without causing deterioration of the photoresist pattern representing the interconnect structure.

8 Claims, 4 Drawing Figures

METHOD FOR FORMING AN ALUMINUM INTERCONNECT STRUCTURE ON AN INTEGRATED CIRCUIT CHIP

RELATED U.S. PATENT APPLICATION

U.S. Patent Application directly or indirectly related to the subject application is as follows: Ser. No. 892,916, filed Apr. 3, 1978 by Dan Cancelleri, et al, and entitled "Apparatus for Forming an Aluminum Interconnect Structure on an Integrated Circuit Chip".

BACKGROUND OF THE INVENTION

1. Field of the Invention

This invention relates to a method for the formation of aluminum conductive interconnections on an integrated circuit chip; and more particularly, to such method and apparatus wherein the number of required steps is substantially reduced.

2. Description of the Prior Art

In the formation of integrated circuit chips, the active elements are formed on and in a silicon wafer by diffusion, ion implant, and so forth, and the electrical interconnections between the various elements in the wafer can be formed by depositing aluminum over the respective chips and then anodizing the aluminum in a particular pattern to form the respective conductor circuits. In the anodization process, a barrier layer of aluminum oxide is formed over the aluminum and a photoresist pattern is then placed on the barrier layer. The barrier layer prevents the formation of hillocks in the aluminum during later processing. The barrier layer is then etched through the photoresist pattern and those portions of the aluminum layer thus exposed are then subsequently anodized to form insulating areas that define the conductive circuit patterns.

In prior art processes, the etchant employed to etch the barrier aluminum oxide layer was of such a nature as to cause deterioration of the photoresist pattern. Thus, the etching process had to be interrupted a number of times and the photoresist pattern again baked with each interruption and baking procedure taking extra amounts of time. Furthermore, after the barrier layer had been etched completely through, the wafer was then removed to a separate facility to anodize the exposed aluminum. The entire process required a number of handling steps, each one of which increased the chances of breakage of the wafer in addition to increasing the amount of time to prepare the conductive pattern.

It is, then, an object of the present invention to provide an improved process and apparatus for the etching and anodization of an aluminum conductive pattern on the surface of integrated circuit chip.

It is still another object of the present invention to provide an improved process and apparatus for the etching and anodization of an aluminum conductive pattern which does not require the interruption of the etching process and resulting loss of time.

It is still a further object of the present invention to provide an improved process and apparatus for the etching and anodization of an aluminum conductive pattern which requires a minimum number of handling steps and a reduced chance of breakage of the wafer being processed.

SUMMARY OF THE INVENTION

In order to accomplish the above-identified objects, the present invention is directed toward a method for forming an interconnect structure on an integrated circuit chip by employing a single chamber for both the required etching and anodization. It has been discovered that an etchant-electrolyte such as phosphoric acid solution in the ratios of one part phosphoric acid to four parts of water can serve as both an etchant and an electrolyte without causing deterioration of the photoresist pattern representing the interconnect structure.

The present invention then resides in the method and apparatus by which aluminum oxide may be etched and aluminum anodized in a single chamber.

DESCRIPTION OF THE DRAWINGS

The above and other objects, advantages and features of the present invention will become more readily apparent from a review of the following specification when taken in conjunction with the drawings wherein.

GENERAL DESCRIPTION OF THE INVENTION

Figure 1A:
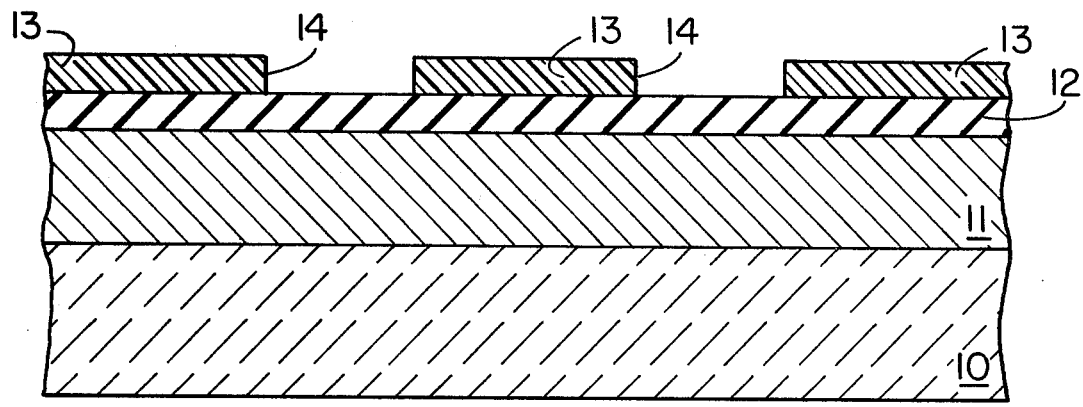
FIGS. 1A and 1B are cross-sectional views of a semiconductor device fabricated by the present invention.

The structure of the interconnection circuitry formed on top of the integrated circuit chip will now be described in relation to FIGS. 1A and 1B. As shown therein, aluminum layer 11 is formed over silicon semiconductive substrate 10 after the various active devices have been created therein. A hard barrier layer 12 of aluminum oxide is then created on the surface of the aluminum layer 11 for the purpose of receiving the photoresist layer 13 which defines the conductive patter of the interconnecting circuitry. Hard barrier layer 12 provides better adhesion for photoresist layer 13 and also prevents hillocks from being formed on the surface of the aluminum layer 11 which might subsequently deform a passivating layer and cause short circuiting with another conductive layer such as 16. Hard barrier layer 12 is then etched through the photoresist pattern to create openings 14 therein so as to expose portions of aluminum layer 11 that are to be rendered nonconductive by a subsequent anodization process. The exposed portions of aluminum layer 11 are then anodized to create porous aluminum oxide regions 15 which acts as insulators between the portions of aluminum layer 11 that were not anodized and form the conductive circuitry.

As was explained above, prior art etchants as employed in this process, which contain hydrofluoric acid and surface conditioners, have a tendency to deteriorate photoresist layers 12, and thus, the etching process has to be interrupted a number of times to again bake photoresist layers 13. In addition, after the etching process has been completed, the semiconductive wafer is then removed to a separate chamber for the anodization process. These additional handling steps not only increase the chances of breakage of the respective wafers, but also increase the time required to prepare the respective conductive patterns.

With prior art etchings, the wafers are first provided with the aluminum layer and then the aluminum oxide hard barrier layer and the photoresist pattern is applied. The wafers are then normally descummed in a plasma oven which takes about 20 minutes. The photoresist pattern is then baked at about 155° centigrade for about 40 minutes. Then a special etch is done which takes one minute and wafer is rinsed in water for about 5 or 10 minutes. Then the photoresist pattern is again baked for about 40 minutes, and a second etch is performed which takes about 45 seconds. After the second etch, the wafer is then rinsed for about 5 or 10 minutes and then baked at about 155° for forty minutes. The baking and etching process takes about 162 minutes including the handling operations. After this process, the conductive pattern in the exposed aluminum is then defined by anodization which takes a little more than an hour.

In the present invention, it has been discovered that with an etchant of a phosphoric acid solution without hydrofluoric acid and of surfaces conditions which solution is maintained as a constant temperature bath, the photoresist pattern is not readily attacked and therefore the repetition of the baking and etching process can be eliminated. Furthermore, such an etchant also serves as an electrolyte during the subsequent anodization process which allows both the etching and the anodization process to be carried out in the same chamber thus eliminating extra handling steps. The particular etchant-electrolyte employed in the present invention is a solution of one part phosphoric acid to 4 parts of water.

With the present invention, both the etching and the anodization of the aluminum interconnecting circuitry can be accomplished in approximately 30 minutes as a single two-phase operation. Of course, the prebaking of the photoresist material is still required. After the anodization, wafers then can be removed and sent to the next step in the overall wafer processing.

As was indicated above, one of the features of the present invention that allows for the saving of time is that the etchant-electrolyte is kept at a constant temperature and this requires that the etchant-electrolyte constantly flows over and around the wafer being processed. In the present invention, the etchant is kept in a constant temperature reservoir separate from the etchant-anodization chamber and supplied therefrom to provide a constant flow. With the present invention any number of etchant-anodization chambers can be coupled to the constant temperature reservoir so that any number of wafers can be processed at one time.

DESCRIPTION OF THE APPARATUS

Figure 2:
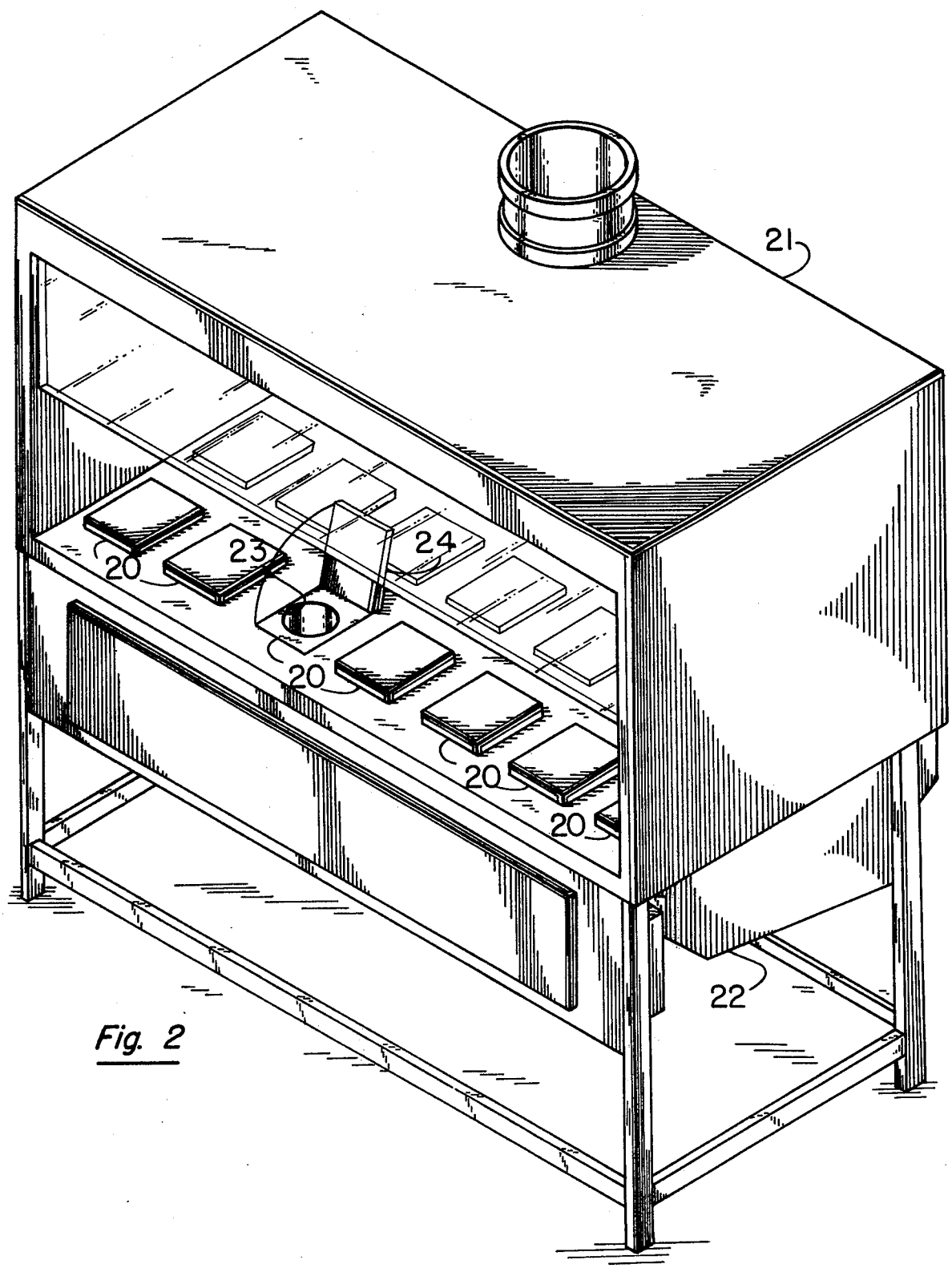
FIG. 2 is a three-dimensional view of apparatus employed in the present invention.

A system employing the apparatus of the present invention is illustrated generally in FIG. 2, wherein a number of processing units 20 are mounted within chemical hood 21; each unit being in communication with constant temperature reservoir 22. Each of units 20 is formed of a cup-like container 23 to receive the wafer that is to be processed and pivotable cover 24 which contains the respective electrodes and other access ports as will be more than thoroughly described below.

Figure 3:
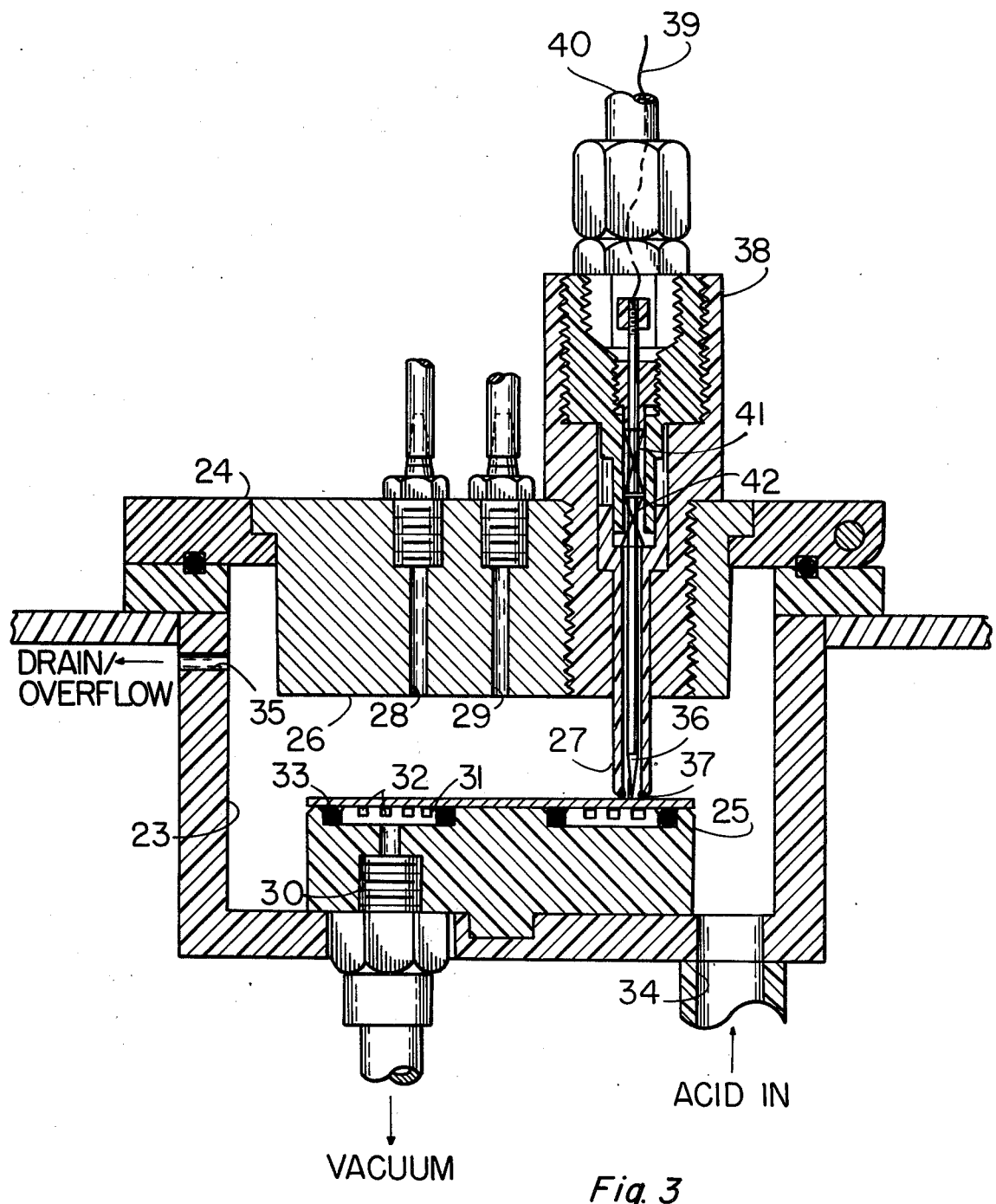
FIG. 3 is a cross-sectional view of an etching and anodization chamber as employed in the present invention.

A cross-sectional view of a single processing unit is illustrated in FIG. 3. As shown therein, container 23 is provided with pedestal 25 on the bottom thereof to receive and support the wafer being processed. The wafer is secured to the pedestal by a vacuum system coupled to a vacuum port 30 that is connected to grooved annular ring 31, grooves 32 of which are in communication with vacuum port 30. Cover 24 is provided with planar cathode 26 whose surface is parallel with the wafer being processed when cover 24 is in its down position.

Planar cathode 26, is provided with an insulating insert 38 which supports the anode assembly. This includes a protective sleeve 27 which houses anode 36.

Anode 36 is forced into contact with wafer 10 by spring 41 and the protective sleeve 27 is also forced into contact with wafer 10 by spring 42, the actual contact between sleeve 27 and wafer 10 being made by O-ring 37 for reasons which will be more thoroughly described below. Anode 36 is then connected to a positive power source by conductor 39 which is housed in conduit 40. Planar cathode 26 is also provided with an appropriate electrical connection (not shown).

The purpose of conduit 40 is to supply nitrogen under pressure which is forced along the sides of anode 36 in protective sleeve 27. Thus, should there be any leak in O-ring 37, the pressurized nitrogen would be forced out of sleeve 27 rather than allowing the etchant-electrolyte solution which surrounds sleeve 27 to make contact with anode 36. Thus, during the anodization process, wafer 10 is maintained at a voltage positive relative to planar cathode 26.

Planar cathode 26 is also provided with nitrogen conduit 28 and the deionized-water conduit 29 for employment after the anodization process, conduit 29 supplying the deionized water to rinse wafer 10 and the conduit 28 supplying nitrogen to purge the chamber and dry off any excess water before the wafer is removed from chamber 23.

DESCRIPTION OF THE METHOD

Figure 1B:
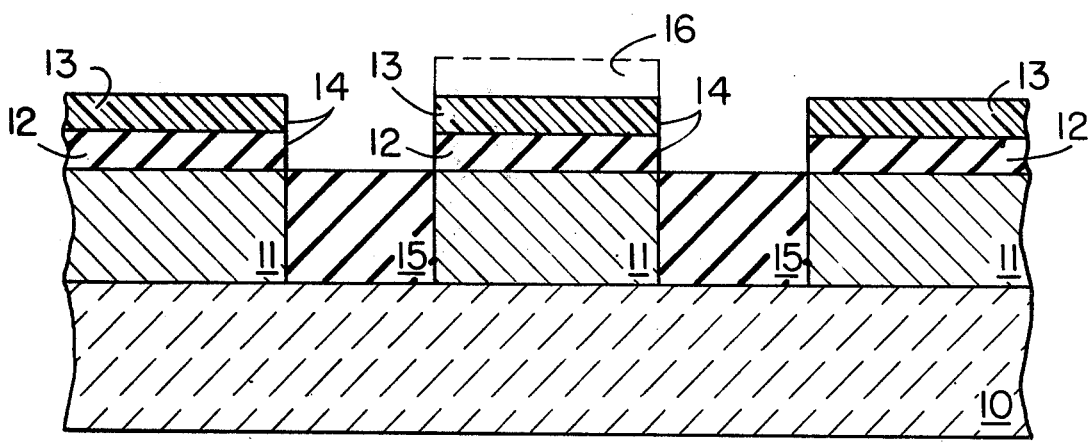

With the apparatus described above, the silicon wafer, such as is described in relation to FIGS. 1A and 1B, is covered with aluminum layer 11, the outer surface of which is anodized to form a hard barrier layer 12. A photoresist layer 13 is supplied thereto to form a conductive pattern which photoresist layer is baked for about 30 minutes and the wafer is then placed in chamber 23 of the apparatus of FIGS. 2 and 3. Chamber 23 is filled with the etchant-electrolyte solution of 1 part phosphoric acid and 4 parts water. The solution is pumped into the chamber 23 so as to constantly flow over the surface of wafer 10. The solution is maintained at a constant temperature of approximately 13° C. so as not to cause the photoresist material to deteriorate. After approximately 5 minutes, the appropriate pattern has been etched through barrier layer 12 and electrical power is then supplied to planar cathode 26 and anode 36 of FIG. 3. This causes the anodization process to begin which process is maintained for approximately 10–20 minutes. The chamber is then drained of the etchant-electrolyte solution and the wafer surface is rinsed with the deionized water, after which any water in the chamber is driven off by nitrogen which purges the chamber. The wafer may then be removed from the chamber and sent on to the next step in the process of forming the interconnective structure.

One of the features of the present invention which aids in the anodization process is that the anode and cathode are driven by a half-rectified A.C. power source rather than a D.C. power source. This half-rectified alternating current depletes the aluminum ions at the aluminum layer surface which ions hinder the initiation of the oxidation process.

Specifically, after the photoresist pattern has been prepared and baked, the time required for the present process requires approximately 34±6 minutes. After the wafer has been placed in the chamber, the chamber may be filled with the etchant-electrolyte solution in approximately two minutes. At this time, the nitrogen purge of the anode is turned on. The etch requires approximately five minutes. The appropriate voltages are then supplied to the cathode and anode and the anodization takes approximately 15 ± minutes. The chamber is drained of the solution in one minute after which the wafer is rinsed with deionized water for approximately 3 to 5 minutes. The wafer is then dried and the chamber purged with nitrogen for approximately 5 minutes.

The above method and apparatus allows approximately 1,100 angstroms of aluminum oxide to be etched in 5 minutes. Similarily, approximately 10,000±1,000 angstroms of aluminum may be anodized in approximately 15 ± five minutes.

EPILOGUE

A method has been described above by which the aluminum interconnect structure on an integrated circuit chip may be formed in a single chamber by which, by the employment of the appropriate etchant-electrolyte, aluminum oxide may be etched and aluminum may be anodized. With this method and apparatus, the time required for the fabrication of the interconnect structure can be substantially reduced from more than an hour to a little more than thirty minutes, excluding the time for the preparation of the photoresist pattern.

While only one embodiment of the present invention has been disclosed, it will be apparent to those skilled in the arts that variations and modifications can be made therein without departing from the spirit and the scope of the invention as claimed.

What is claimed is:

1. A method of forming an aluminum interconnect structure on an integrated circuit chip by employing a chamber having a pedestal to receive a wafer in an etchant-electrolyte solution, an anode and a cathode, which structure is formed of an aluminum layer having a hard barrier aluminum oxide layer thereon and a resist pattern to define the interconnect structure, said method comprising:

placing a wafer to have said integrated circuit chip in said chamber on said pedestal;
filling said chamber with an etchant-electrolyte solution to etch said aluminum oxide layer and expose portions of said aluminum layer; and
supplying voltages to said anode and cathode after said wafer has resided in said solution for a finite time so as to anodize said exposed portions.

2. A method according to claim 1 wherein:
the etchant-electrolyte solution is a solution of phosphoric acid in the ratio of one part phosphoric acid and four parts water.

3. A method according to claim 1 which further includes the steps of:
removing the voltages from said anode and cathode after a second finite period of time:
rinsing the wafer with deionized water; and
purging the chamber with nitrogen.

4. A method according to claim 3 wherein:
said finite period of time is sufficient to etch the aluminum oxide by approximately one thousand angstroms and said second period of time is sufficient to anodize the underlying aluminum layer by approximately 10,000 angstroms.

5. A method according to claim 4 wherein:
said finite period of time is approximately 5 minutes and second finite period of time is approximately 10-2- minutes.

6. A method according to claim 1 wherein:
said etchant-electrolyte solution is maintained at a constant temperature.

7. A method according to claim 5 wherein:
said etchant-electrolyte is maintained at a temperature of approximately 13° Centigrade.

8. A method according to claim 1 wherein:
the voltage applied to said anode and cathode are half-rectified alternating current voltages.

* * * * *